(12) United States Patent
Sonoda (10) Patent No.: US 6,385,219 B1
(45) Date of Patent: May 7, 2002

(54) LASER DIODE PUMPED SOLID STATE LASER

(75) Inventor: Shinichiro Sonoda, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/343,205

(22) Filed: Jun. 30, 1999

(30) Foreign Application Priority Data

Jun. 30, 1998 (JP) ............................................. 10-183475

(51) Int. Cl.[7] .............................. H01S 3/10; H01S 3/091
(52) U.S. Cl. ................................. 372/28; 372/26; 372/70
(58) Field of Search ............................. 372/26, 28, 70, 372/71, 75

(56) References Cited

U.S. PATENT DOCUMENTS

| | | | | |
|---|---|---|---|---|
| 4,796,264 A | * | 1/1989 | Suzuki | 372/29.015 |
| 4,910,472 A | * | 3/1990 | Tanino | 331/113 |
| 5,285,467 A | * | 2/1994 | Scheps | 372/69 |
| 5,379,144 A | * | 1/1995 | Shirasaki | 359/181 |
| 5,386,429 A | * | 1/1995 | Naito et al. | 372/46 |
| 5,822,345 A | * | 10/1998 | Sousa et al. | 372/38 |
| 6,011,768 A | * | 1/2000 | Taguchi | 369/116 |
| 6,055,251 A | * | 4/2000 | Ouchi et al. | 372/28 |
| 6,272,100 B1 | * | 8/2001 | Toda et al. | 369/116 |

FOREIGN PATENT DOCUMENTS

| | | | |
|---|---|---|---|
| EP | 0 656 675 | 6/1995 | H01S/3/0941 |
| JP | 6-283786 | 10/1994 | H01S/3/094 |

OTHER PUBLICATIONS

Patent Abstracts of Japan, vol. 016, No. 291 (E–1224) Jun. 26, 1992 & 04 076974 A (Sony Corp) Mar. 11, 1992 *Abstract.

* cited by examiner

*Primary Examiner*—Paul Ip
*Assistant Examiner*—James Menefee
(74) *Attorney, Agent, or Firm*—Sughrue Mion, PLLC (57) ABSTRACT

A laser diode pumped solid state laser includes a solid laser medium, and an index optical waveguide type laser diode which emits a pumping light beam for pumping the laser medium. A high-frequency which is higher than a response frequency of the solid laser medium and is of an amplitude which makes a percentage modulation of the light output of the laser diode a value not smaller than 50% and smaller than 100% is superposed on a drive current for the laser diode.

13 Claims, 15 Drawing Sheets

1msec/div

1msec/div

LASER DIODE PUMPED SOLID STATE LASER

BACKGROUND OF THE INVENTION

1. Field of the Invention

This invention relates to a laser diode (semiconductor laser) pumped solid state laser in which a solid laser medium is pumped by a laser diode, and more particularly to a laser diode pumped solid state laser in which the pumping laser diode is driven by a drive current superposed with a high-frequency.

2. Description of the Related Art

As disclosed, for instance, in Japanese Unexamined Patent Publication No. 62(1987)-189783, there has been known a laser diode pumped solid state laser in which a solid laser medium is pumped by a laser diode.

Figure 2A:
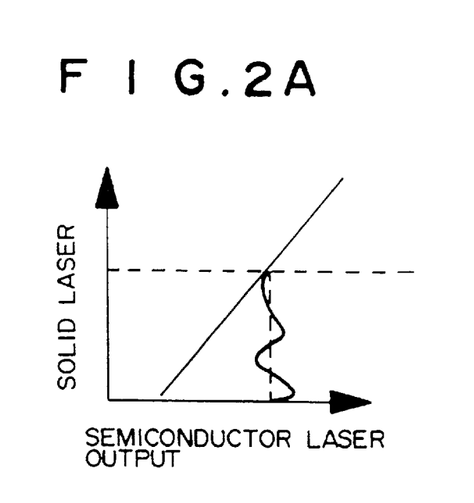
FIGS. 2A and 2B are views for illustrating generation of noise in a laser diode pumped solid state laser.
Figure 2B:
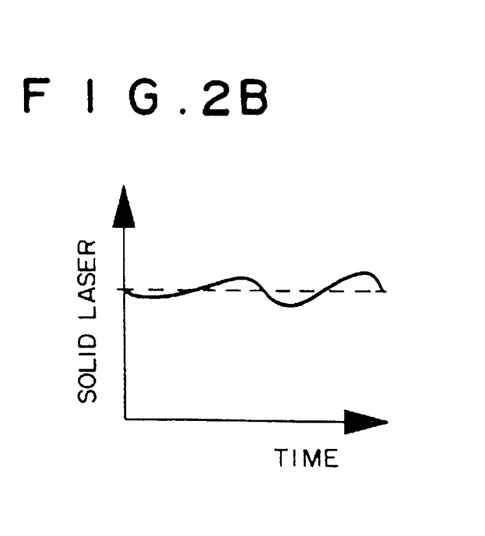

In such a laser diode pumped solid state laser, noise is sometimes generated in light output of the solid state laser when the laser diode is subjected to mode hop due to change in temperature and/or drive current and light output of the laser diode fluctuates. That is, when the light output of the laser diode fluctuates with time as shown in FIG. 2A, the light output of the solid state laser fluctuates with change in the light output of the laser diode and noise is generated in the light output of the solid state laser as shown in FIG. 2B.

As the method of preventing fluctuation in the light output of the laser diode (generation of noise), the following methods have been known.

(a) A method disclosed in Japanese Unexamined Patent Publication No. 4(1992)-76974 in which a high-frequency higher than the response frequency of the solid laser medium is superposed on the drive current for a laser diode of a gain optical waveguide type or an index optical waveguide type.

(b) A method disclosed in Japanese Unexamined Patent Publication No. 7(1995)-154014 in which an index optical waveguide type broad-area laser is employed as the pumping laser diode.

Figure 16:
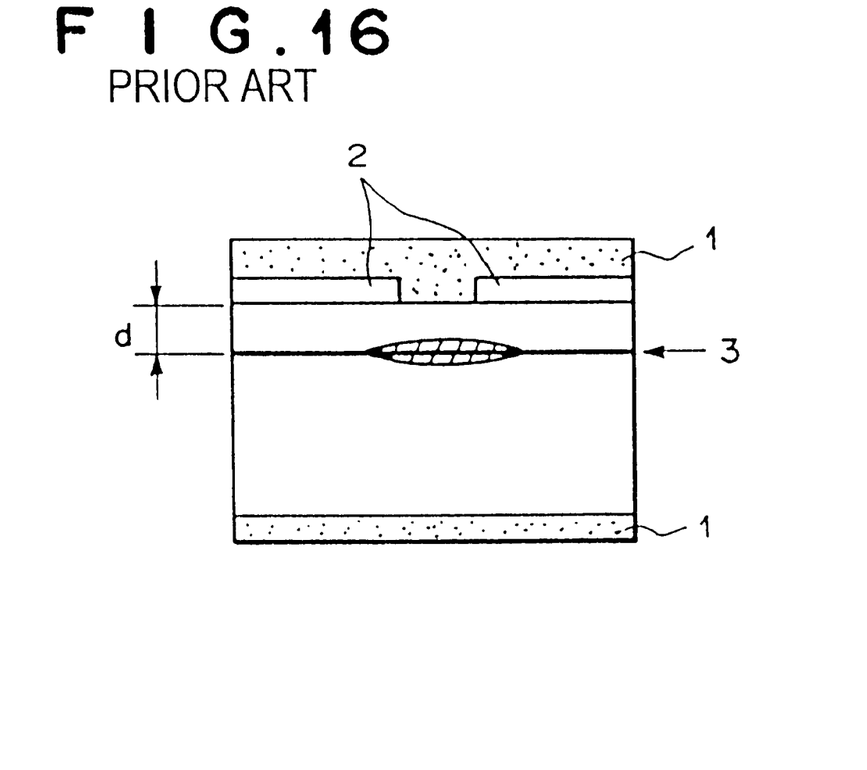
FIG. 16 is a schematic view showing a basic structure of a gain optical waveguide type laser diode.
Figure 17:
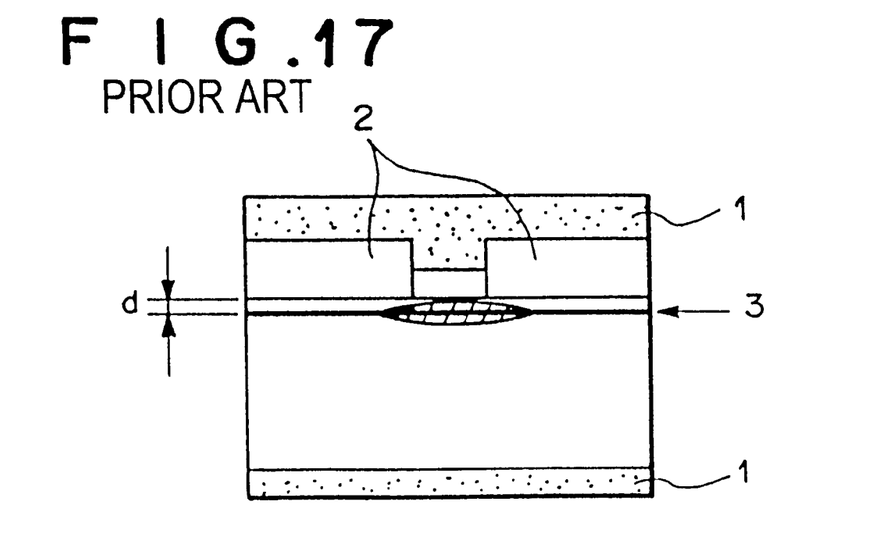
FIG. 17 is a schematic view showing a basic structure of an index optical waveguide type laser diode.

The basic structures of the gain optical waveguide type laser diode and the index optical waveguide type laser diode will be described with reference to FIGS. 16 and 17, hereinbelow. In FIGS. 16 and 17, the hatched ellipse represents a cross-section of the beam, and reference numerals 1, 2 and 3 respectively denote a metal electrode, a low refractive index layer such as of $SiO_2$ and an active layer.

When a laser diode is sufficiently large in the distance d between the active layer 3 and the low refractive index layer 2 as compared with the longitudinal beam diameter which is generally not larger than 1 $\mu$m as shown in FIG. 16, the laser diode is of a gain optical waveguide having no index structure with respective to a transverse beam.

To the contrast, when the distance d between the active layer 3 and the low refractive index layer 2 is smaller than the longitudinal beam diameter in a laser diode as shown in FIG. 17, the laser diode is of an index optical waveguide having an index structure with respective to a transverse beam.

In the method of (a), when a gain optical waveguide type laser diode is employed, the current to be applied to the laser diode must be held not higher than the threshold in order to lower coherency of the pumping light beam emitted from the laser diode. In order to keep unchanged the mean output of the laser diode under this condition, the peak power must be at least twice the mean output. Since the peak power is thus close to the maximum output when the laser diode is driven at a high output, the laser diode can excessively deteriorate or fail.

To the contrast, in the method of (b), noise generated by the laser diode itself is reduced as compared with when a gain optical waveguide broad-area laser is employed. However a certain amount of noise is still generated.

SUMMARY OF THE INVENTION

In view of the foregoing observations and description, the primary object of the present invention is to provide a laser diode pumped solid state laser in which generation of noise due to fluctuation of the light output of the laser diode can be sufficiently suppressed.

In accordance with the present invention, there is provided a laser diode pumped solid state laser comprising a solid laser medium, and an index optical waveguide type laser diode which emits a pumping light beam for pumping the laser medium, wherein the improvement comprises a high frequency superposing means which superposes on a drive current for the laser diode a high-frequency which is higher than a response frequency of the solid laser medium and is of an amplitude which makes a percentage modulation of the light output of the laser diode a value not smaller than 50% and smaller than 100%.

Preferably the high-frequency is of an amplitude which makes the percentage modulation of the light output of the laser diode a value not smaller than 50% and not larger than 80%.

Preferably the frequency of the high-frequency is not lower than 20 MHz.

It is preferred that the laser diode be a multiple transverse mode broad-area laser.

Further it is preferred that the laser diode has index steps produced by a ridge structure.

Figure 3A:
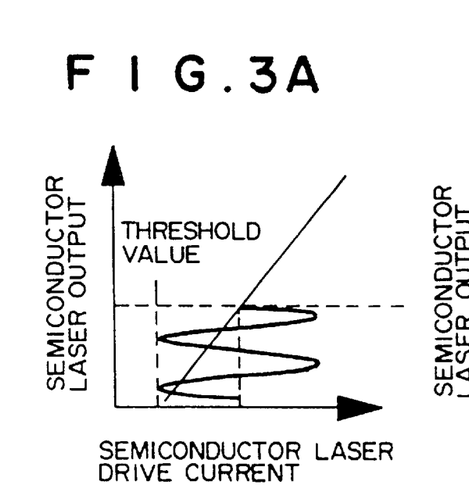
FIGS. 3A and 3B are views for illustrating the relation between superposition of a high-frequency on the laser diode drive current and the percentage modulation of the light output.
Figure 3B:
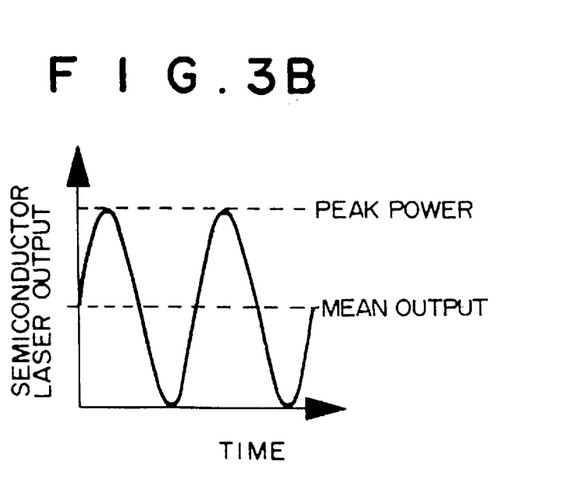
Figure 4A:
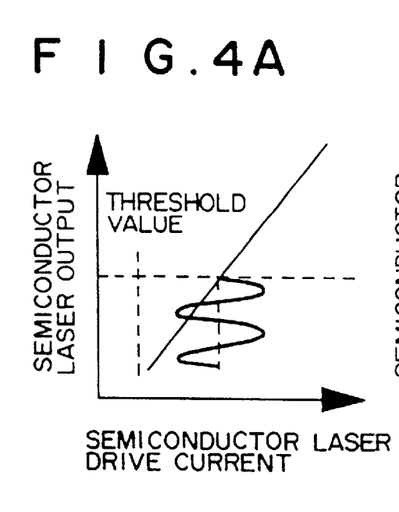
FIGS. 4A and 4B are views for illustrating the relation between superposition of a high-frequency on the laser diode drive current and the percentage modulation of the light output.
Figure 4B:
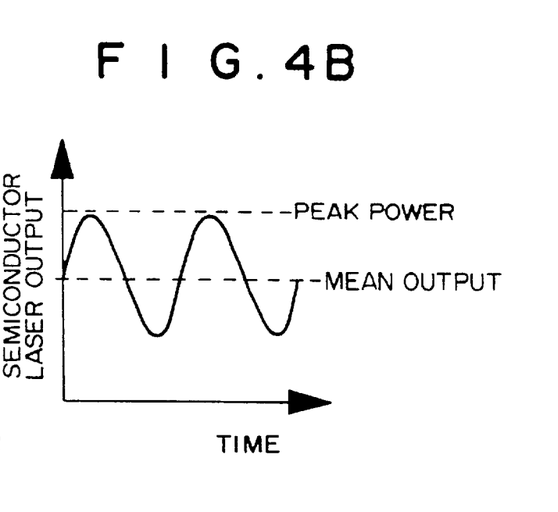

The percentage modulation of the light output of the laser diode is defined as $$P_{p-p}/2P_{DC} \times 100(\%)$$

wherein $P_{DC}$ represents the mean light output (DC component) and $P_{p-p}$ represents the peak-to-peak width of the light output of the laser diode. For example, when the light output of the laser diode changes as shown in FIG. 3B as the laser diode drive current changes as shown in FIG. 3A by superposition of the high-frequency, the percentage modulation is 100% since $P_{p-p}=2P_{DC}$. When the light output of the laser diode changes as shown in FIG. 4B as the laser diode drive current changes as shown in FIG. 4A by superposition of the high-frequency, the percentage modulation is 50% since $P_{p-p}=P_{DC}$.

Figure 5A:
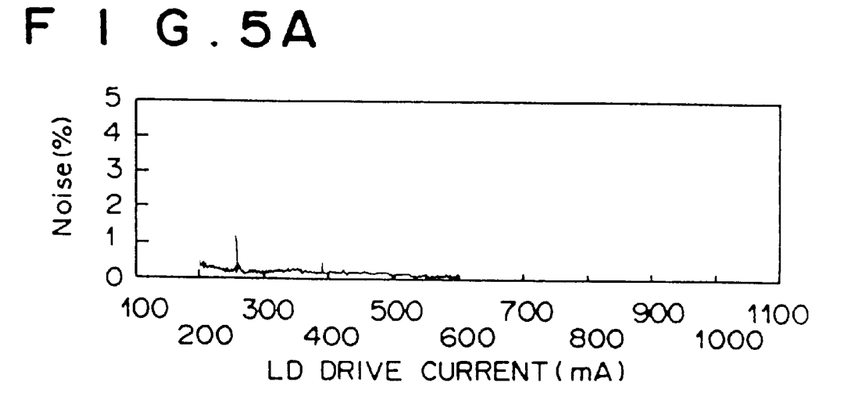
FIGS. 5A to 5C are graphs showing the relation between the amount of noise and the value of the drive current for different laser diodes.
Figure 5B:
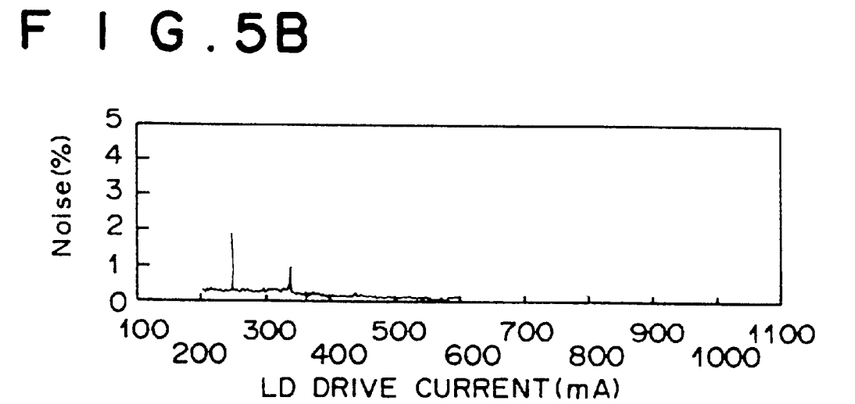
Figure 5C:
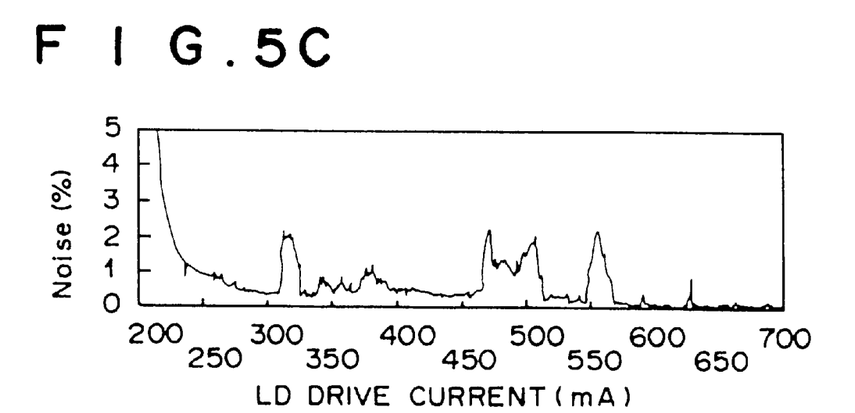

Relation between the drive current and the amount of noise when the laser diode was driven without superposition of a high-frequency was measured for a pair of index optical waveguide type laser diodes and a gain optical waveguide type laser diode. These laser diodes were all multiple transverse mode laser diodes which were about 50 $\mu$m in emission width. Result of the measurement is shown in FIGS. 5A to 5C. FIGS. 5A and 5C are for the index optical waveguide type laser diodes and FIG. 5C is for the gain optical waveguide type laser diode.

As can be understood from FIGS. 5A to 5C, noise was generated over a wide range of the values of the drive current in the case of the gain optical waveguide type laser diode. To the contrast, in the case of the index optical waveguide laser diodes, noise was generated only in an extremely limited range of the values of the drive current. From this fact, it is conceivable that when an index optical waveguide type laser diode is driven by a drive current superposed with a high-frequency, a large noise reduction effect can be obtained even if the amplitude of the high-frequency is relatively small. This invention has been made on the basis of this recognition.

Figure 6:
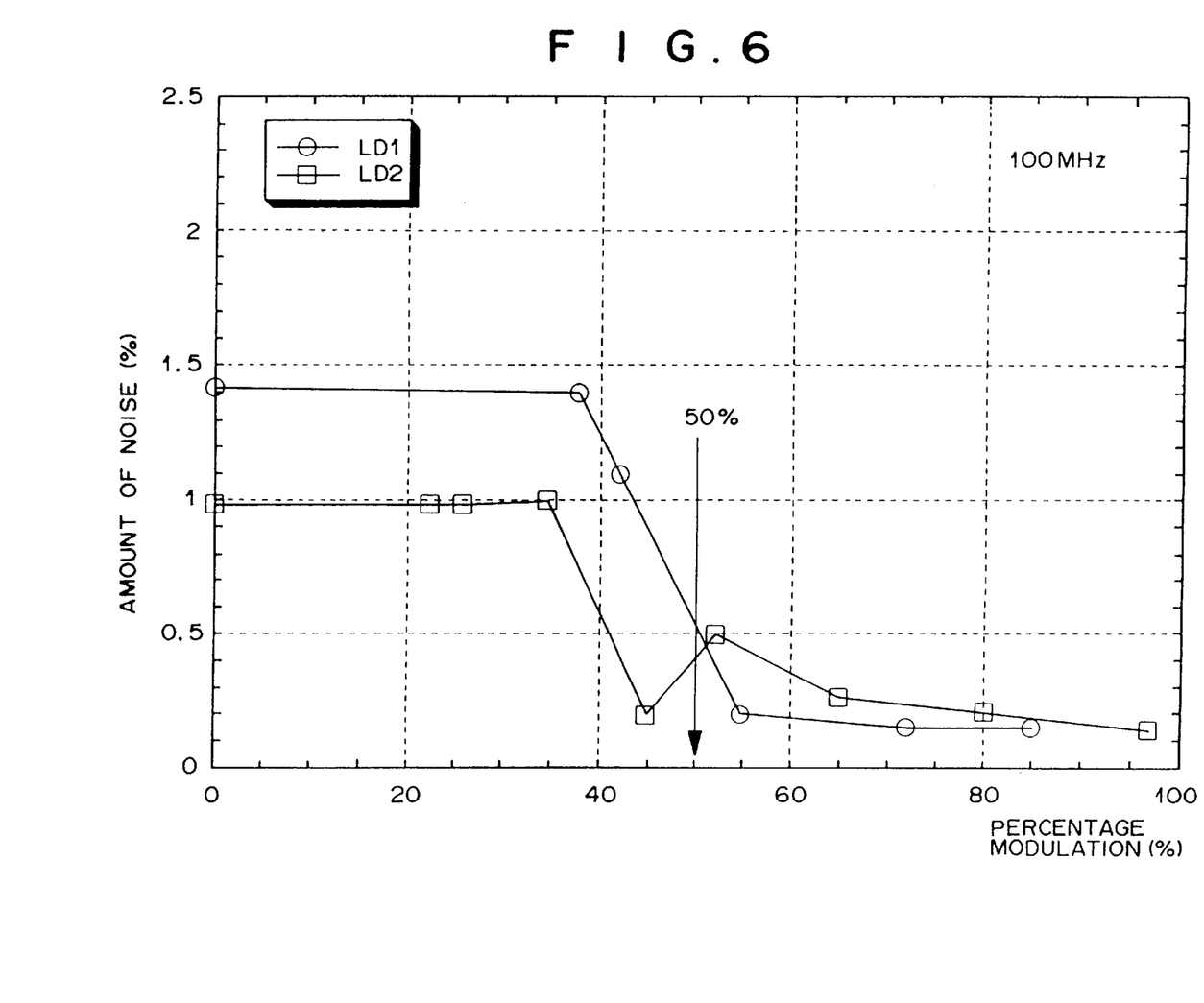
FIG. 6 is a graph showing the relation between the percentage modulation and the amount of noise when a pair of index optical waveguide type laser diodes were driven with superposition of a high-frequency of 100 MHz.

FIG. 6 is a graph showing the relation between the percentage modulation and the amount of noise (to be described later) when a pair of index optical waveguide type laser diodes (LD1 and LD2) were driven with superposition of a high-frequency of 100 MHz. As can be understood from FIG. 6, when the percentage modulation is set not smaller than 50%, the amount of noise can be suppressed to not larger than 0.5%, which is a measure of the amount of noise practically permissible.

Figure 7:
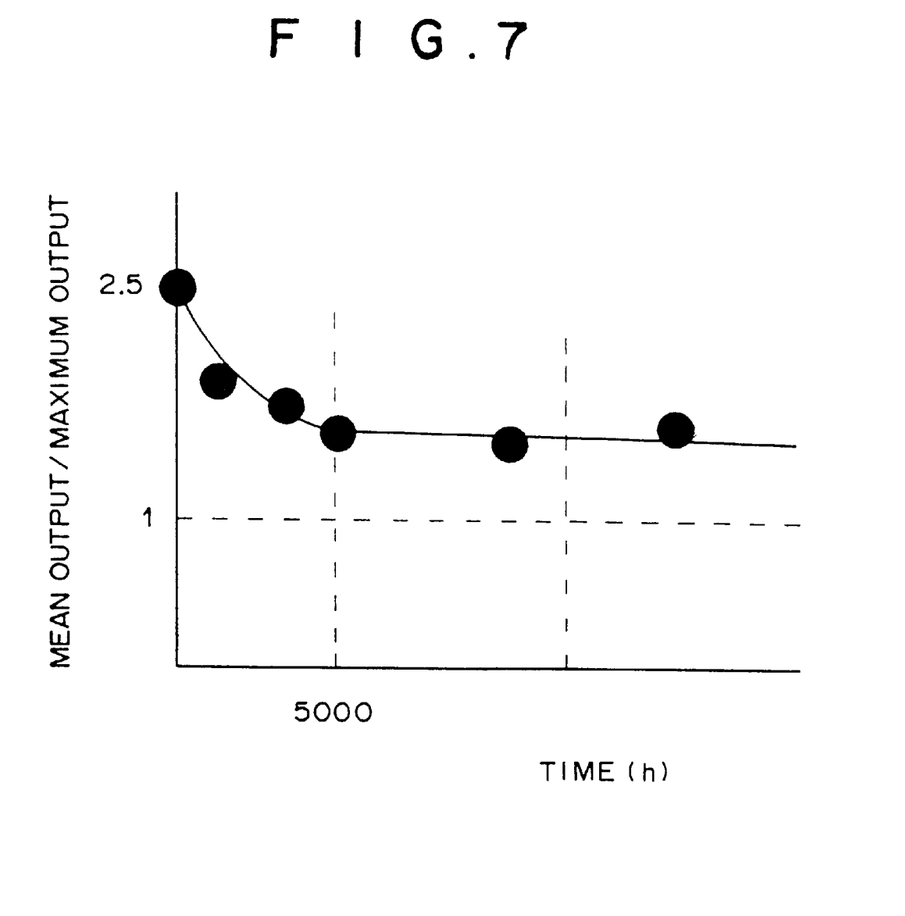
FIG. 7 is a graph showing the relation between the ratio of the mean light output to the maximum light output and the service life when a 800 nm band index optical waveguide type laser diode having a ridge structure was driven with superposition of a high-frequency.

FIG. 7 is a graph showing the relation between the ratio of the mean light output to the maximum light output and the service life when a 800 nm band index optical waveguide type laser diode having a ridge structure was driven with superposition of a high-frequency. The laser diode was 10 to 300 $\mu$m in stripe width and the relation shown in FIG. 7 was obtained when the laser diode was driven with the light output taken as 5 to 15 mW/$\mu$m×stripe width ($\mu$m) (e.g., when the stripe width is 50 $\mu$m, the light output is 250 to 750 mW).

As can be understood from FIG. 7, when the ratio of the mean light output to the maximum light output is not larger than 1.8, that is, the percentage modulation is not larger 80%, a service life not shorter than 5000 hours, which practically gives rise to no problem, can be ensured.

It is needless to say that the percentage modulation may be larger than 80% for applications where a short service life gives rise to no problem. However from the viewpoint of the service life, it is preferred that the percentage modulation be as close to 50% as possible taking into account a variation in elements and the like.

When the percentage modulation of the light output of the laser diode is set not larger than 80%, the maximum light output becomes lower for a given mean light output as compared with when the percentage modulation of the light output of the laser diode is set 100% as in the past, and accordingly the laser diode can be driven with its maximum light output held low.

DESCRIPTION OF THE PREFERRED EMBODIMENTS

[First Embodiment]

Figure 1:
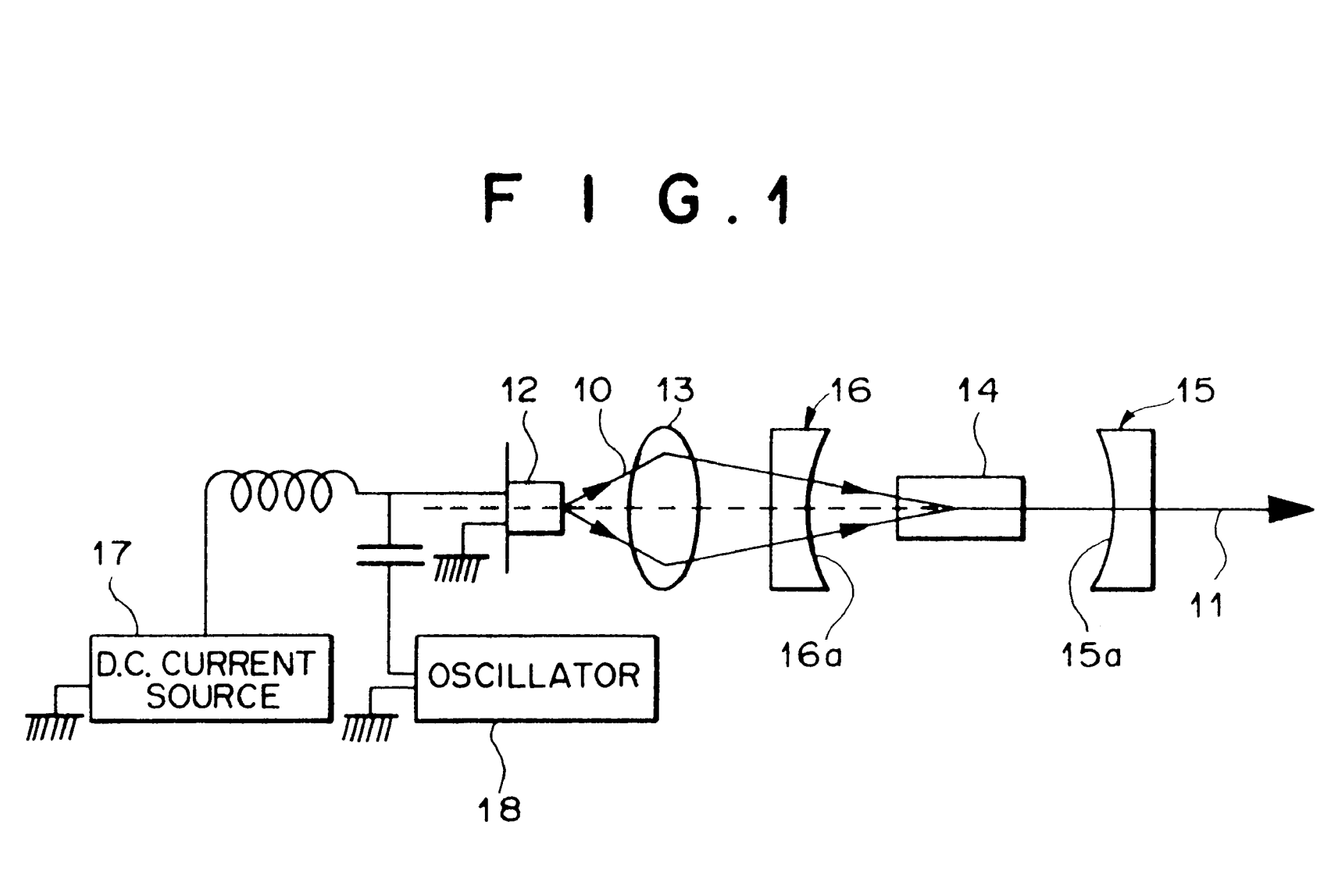
FIG. 1 is a schematic side view of a laser diode pumped solid state laser in accordance with a first embodiment of the present invention.

In FIG. 1, a laser diode pumped solid state laser in accordance with a first embodiment of the present invention comprises a laser diode 12 which emits a pumping laser beam 10, a condenser lens 13 which condenses and converges the pumping laser beam 10 which is a divergent light beam, a Nd:YAG crystal 14 which is a solid laser medium doped with Nd, and front and rear resonator mirrors 15 and 16 which are disposed on opposite sides of the Nd:YAG crystal 14.

The laser diode pumped solid state laser of this embodiment is further provided with a DC current source 17 which supplies a DC drive current to the laser diode 12 and an oscillator 18 which superposes a sine wave high-frequency on the drive current.

The laser diode 12 is an index optical waveguide type multiple transverse mode broad-area laser which has a ridge structure and emits a laser beam 10 at 809 nm. When Nd ions are pumped by the laser beam 10, the Nd:YAG crystal 14 emits light at 1064 nm.

The mirror surface 16a of the rear resonator mirror 16 is provided with coating which well transmits the pumping laser beam 10 at 809 nm (not less than 99% in transmittance) and well reflects light at 1064 nm (not less than 99.9% in reflectance). The mirror surface 15a of the front resonator mirror 15 is provided with coating which well reflects the pumping laser beam 10 and partly transmits light at 1064 nm.

With this arrangement, light at 1064 nm emitted from the Nd:YAG crystal 14 is confined between the mirror surfaces 15a and 16a and generates laser oscillation and a laser beam 11 at 1064 nm thus produced is taken out through the front resonator mirror 15.

A high-frequency of, for instance, 20 MHz is superposed on the laser diode drive current by the oscillator 18. When an oscillation line at 1064 nm is to be obtained by the Nd:YAG crystal 14, the response frequency of the Nd:YAG crystal 14 is about 100 kHz and the frequency of 100 MHz is sufficiently higher than the response frequency of the Nd:YAG crystal 14. The high-frequency is of an amplitude which makes the percentage modulation of the light output of the laser diode 12 a value in the range of 50% to 100%.

When such a high-frequency is superposed on the drive current for the laser diode 12, generation of noise in the solid laser beam 11 is suppressed for the reason described above.

Figure 15:
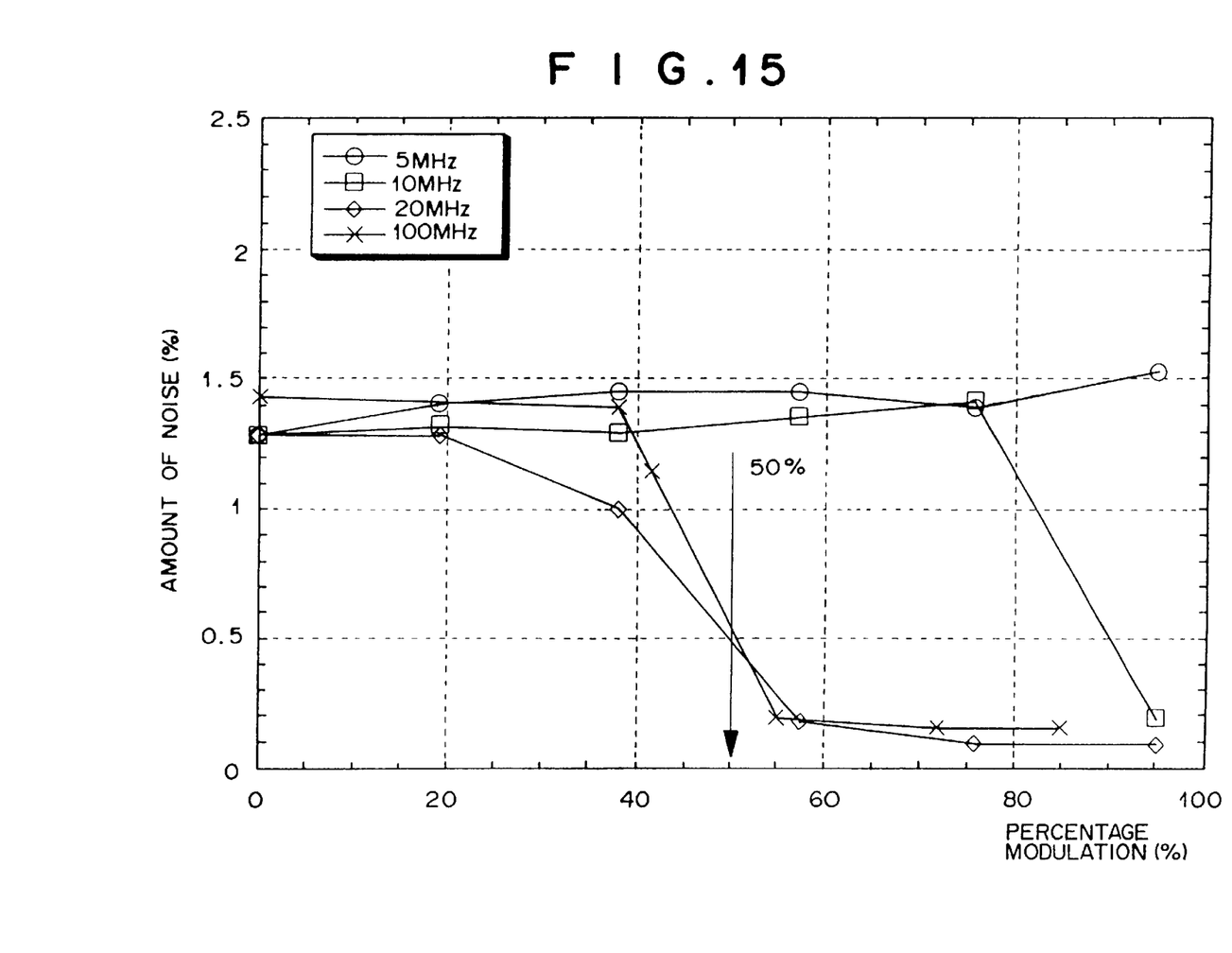
FIG. 15 is a graph showing the relation between the percentage modulation of the light output of the laser diode and the amount of noise for different frequencies when the laser diode pumped solid state laser shown in FIG. 1 was driven with superposition of a high-frequency.

In the laser diode pumped solid state laser of this embodiment, the relation between the percentage modulation of the light output of the laser diode 12 and the amount of noise was investigated while changing the frequency of the high-frequency superposed on the laser diode drive current to 5 MHz, 10 MHz, 20 MHz and 100 MHz. The result was as shown in FIG. 15. As can be understood from FIG. 15, the percentage modulation of the light output of the laser diode 12 can be made not smaller than 50% by setting the frequency of the high-frequency not lower than about 20 MHz.

Comparative Example

Figure 8:
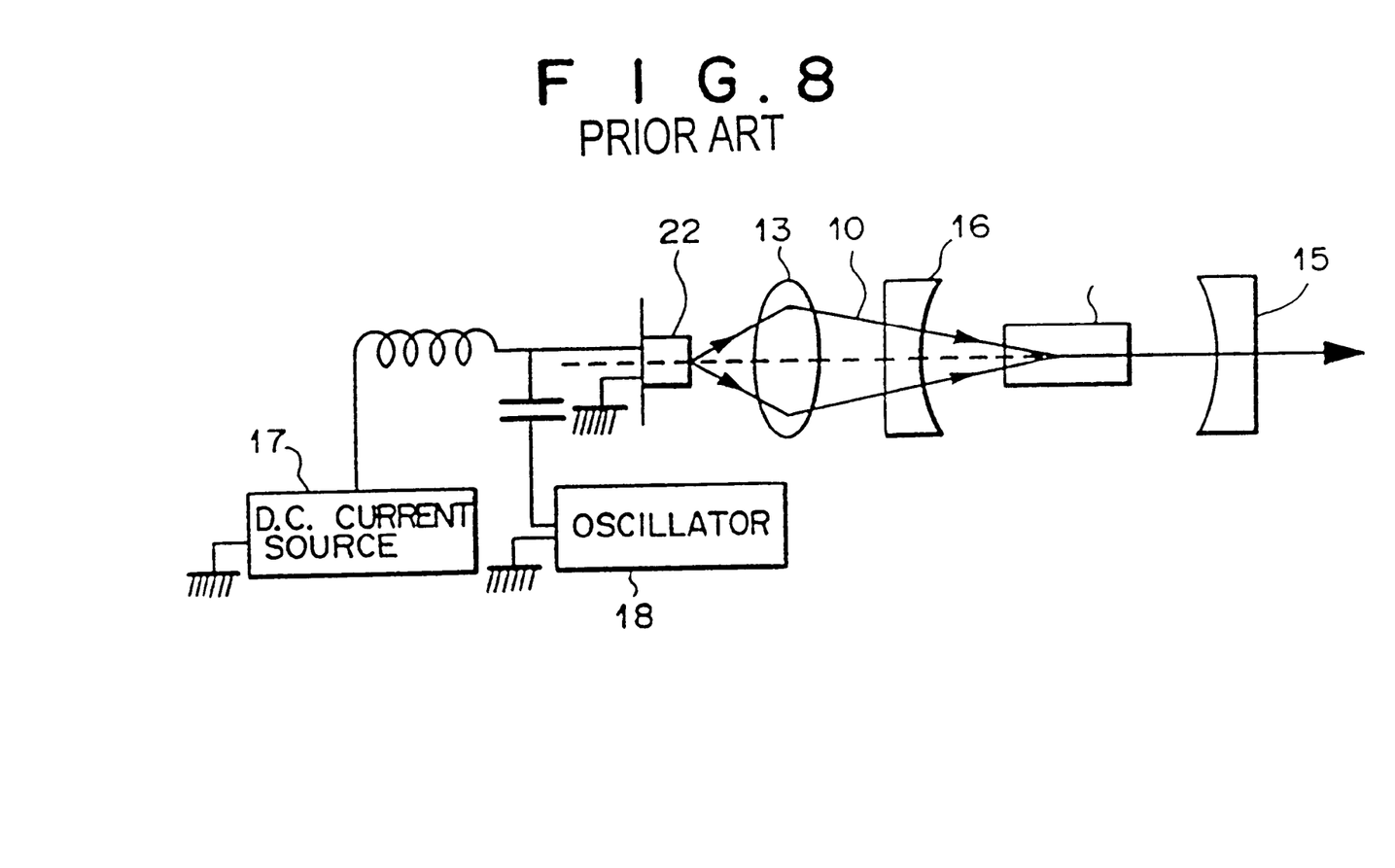
FIG. 8 is a schematic side view showing a conventional laser diode pumped solid state laser in which the pumping laser diode is driven by a drive current superposed with a high-frequency.

Generation of noise in a conventional laser diode pumped solid state laser disclosed in Japanese Unexamined Patent Publication No. 4(1992)-76974 was investigated as a comparative example. The conventional laser diode pumped solid state laser was as shown in FIG. 8. In FIG. 8, the elements analogous to those shown in FIG. 1 are given the same reference numerals and will not be described here.

In this example, as a laser diode 22, an index optical waveguide type laser diode and a gain optical waveguide type laser diode which were about 30 to 300 $\mu$m in emission width were employed. Both the laser diodes were 0.8 $\mu$m in the longitudinal beam diameter. Further the index optical waveguide type laser diode and the gain optical waveguide type laser diode were 0.2 $\mu$m and 2 $\mu$m, respectively, in the distance d between the active layer and the low refractive index layer (See FIGS. 16 and 17).

Figure 9:
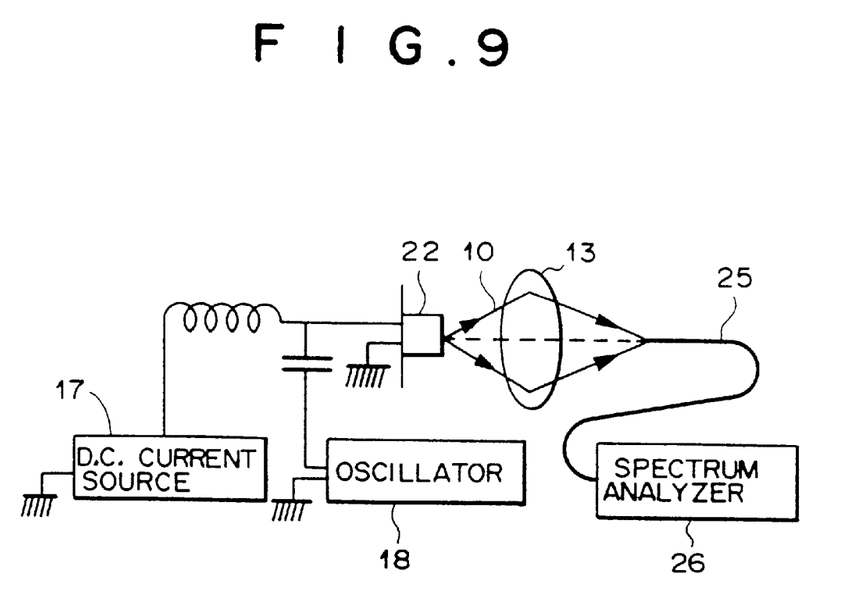
FIG. 9 is a schematic side view showing a system for measuring spectrum of output light of the laser diode in the solid state laser shown in FIG. 8.

Conditions for lowering coherency (frequency and amplitude) were first investigated. Specifically, as shown in FIG. 9, the laser beam 10 converged by the condenser lens 13 was led to a light spectrum analyzer 26 and the condition under which the spectrum of the laser beam 10 spread, that is, the coherency was lowered, was investigated. As a result, it was found that the spectrum spread only when the frequency of the high-frequency superposed on the drive current was not lower than 100 MHz and the percentage modulation was not smaller than 100%.

Further the relation between the amount of noise in the solid laser and the amplitude of the high-frequency (the percentage modulation) was investigated when noise was actually generated from the laser diode 22. The result was as follows.

Figure 10:
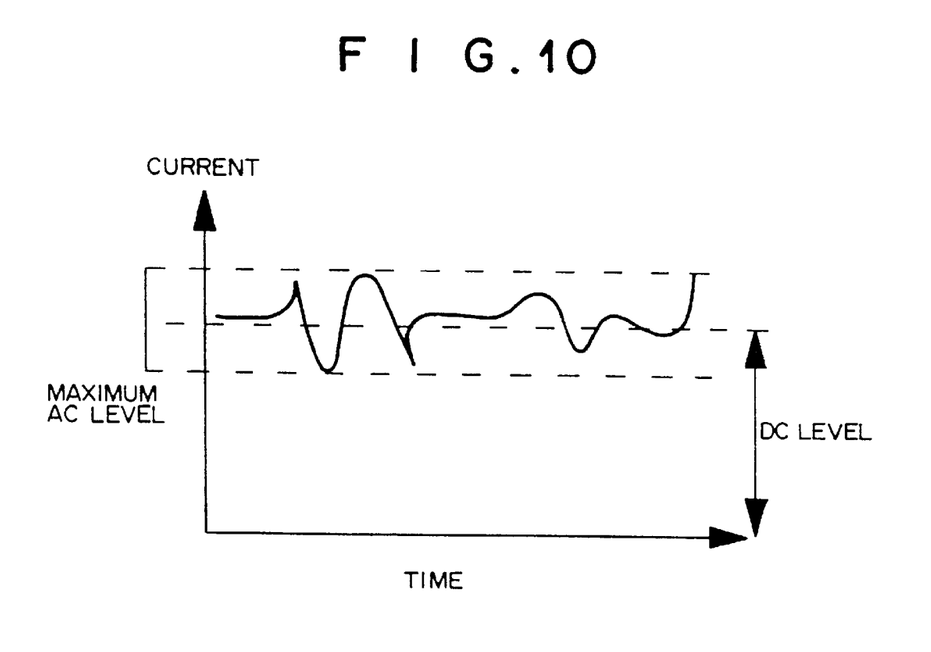
FIG. 10 is a view for illustrating a definition of noise in the solid state laser.

Measurement of noise was carried out by driving the solid state laser shown in FIG. 8 at a constant drive current under a fixed temperature, receiving the solid laser 11 by a photodiode and observing the waveform of the output current through an oscilloscope. Upon measurement, the laser diode drive current was swept from the threshold to a rated maximum, and the maximum AC level/DC level (See FIG. 10) at that time was defined as the amount of noise. More specifically, 10000 pieces of data were measured at intervals of 1 $\mu$sec for 10 msec and the peak-to-peak value at that time was taken as the amplitude of noise. Such measurement was repeated 100 times and a maximum amplitude of noise in the measurements was defined as the amount of noise.

Figure 11A:
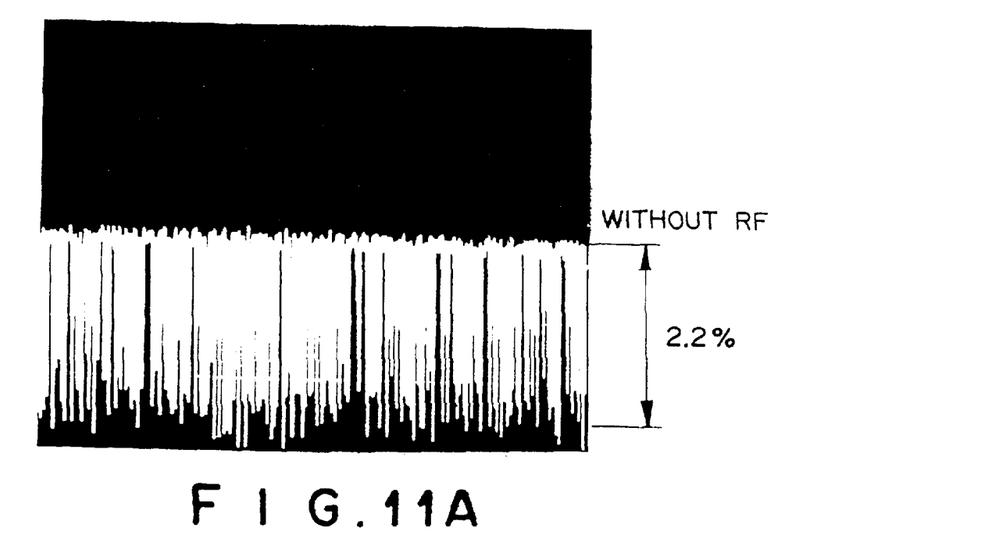
FIGS. 11A and 11B show waveforms observed through the oscilloscope when a gain optical waveguide type laser diode was driven by a drive current with and without superposition of a high-frequency.
Figure 11B:
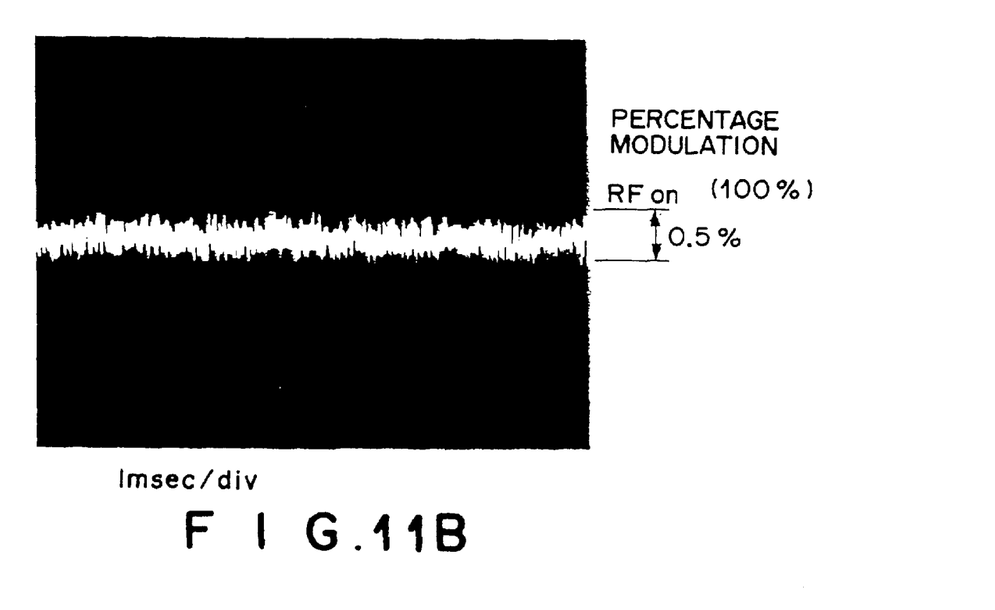

FIGS. 11A, 11B and 12A and 12B show waveforms observed through the oscilloscope. FIG. 11A shows the waveform when the gain optical waveguide type laser diode was driven without superposition of a high-frequency and the amount of noise was 2.2%. FIG. 11B shows the waveform when the gain optical waveguide type laser diode was driven with a high-frequency superposed on the drive current so that the percentage modulation of the light output of the laser diode become 100% and the amount of noise was reduced to 0.5%.

Figure 12A:
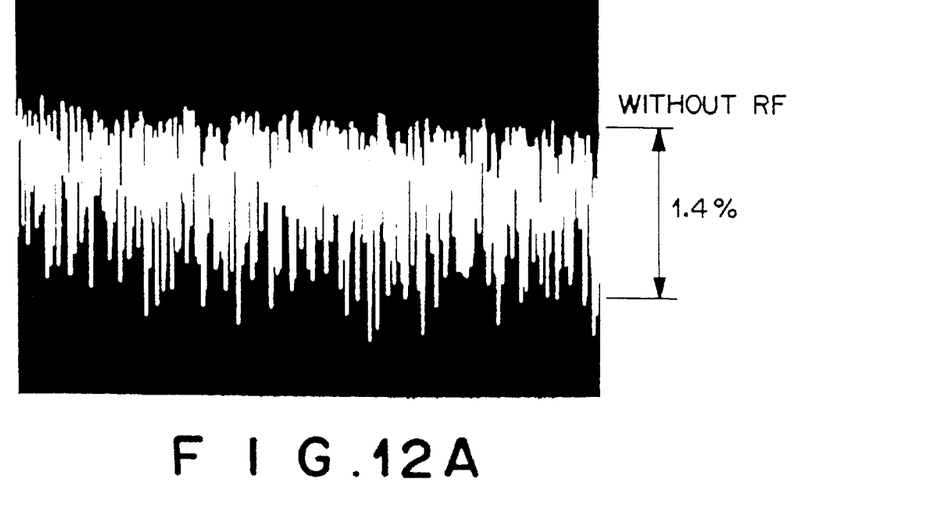
FIGS. 12A and 12B show waveforms observed through the oscilloscope when an index optical waveguide type laser diode was driven by a drive current with and without superposition of a high-frequency.
Figure 12B:
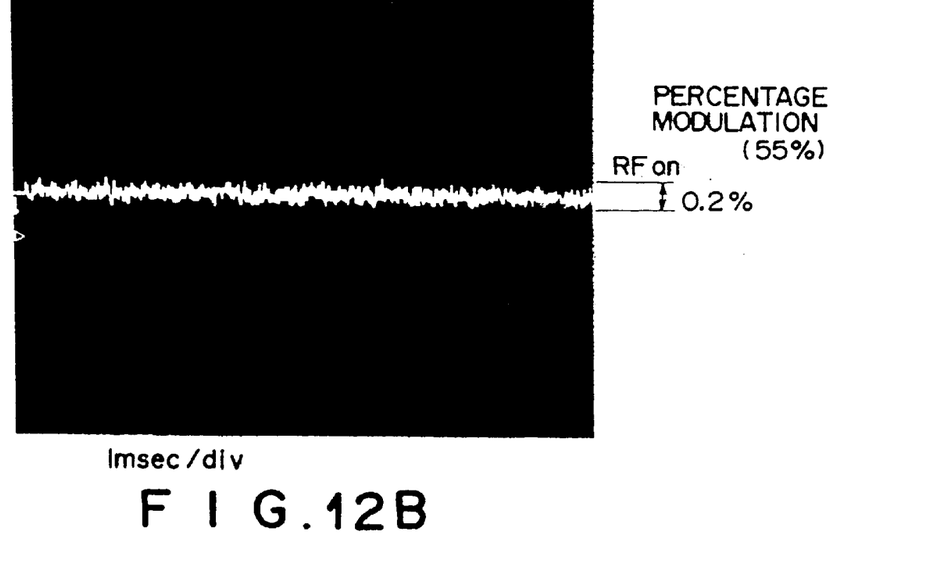

FIG. 12A shows the waveform when the index optical waveguide type laser diode was driven without superposition of a high-frequency and the amount of noise was 1.4%. FIG. 12B shows the waveform when the index optical waveguide type laser diode was driven with a high-frequency superposed on the drive current so that the percentage modulation of the light output of the laser diode become 55% and the amount of noise was reduced to 0.2%.

Figure 13:
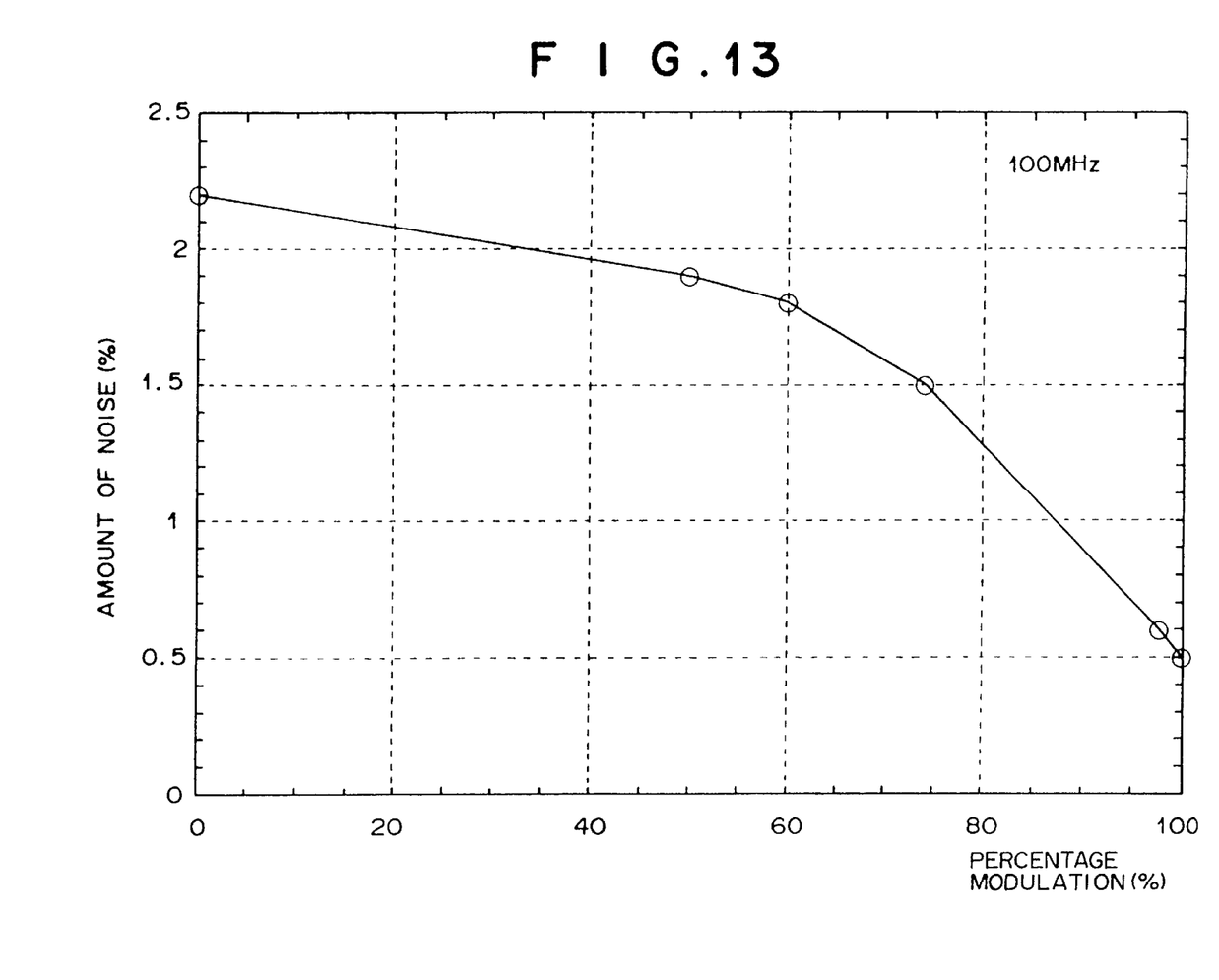
FIG. 13 is a graph showing the relation between the percentage modulation and the amount of noise when the conventional laser diode pumped solid state laser was driven with superposition of a high-frequency.

Further, the relation between the percentage modulation and the amount of noise was investigated while changing the amplitude of the high-frequency with its frequency fixed at 100 MHz. The result was as shown in FIG. 13. As can be understood from FIG. 13, it is necessary to set the percentage modulation to 100% in order to suppress the amount of noise to not larger than 0.5%, which is a measure of the amount of noise practically permissible.

[Second Embodiment]

Figure 14:
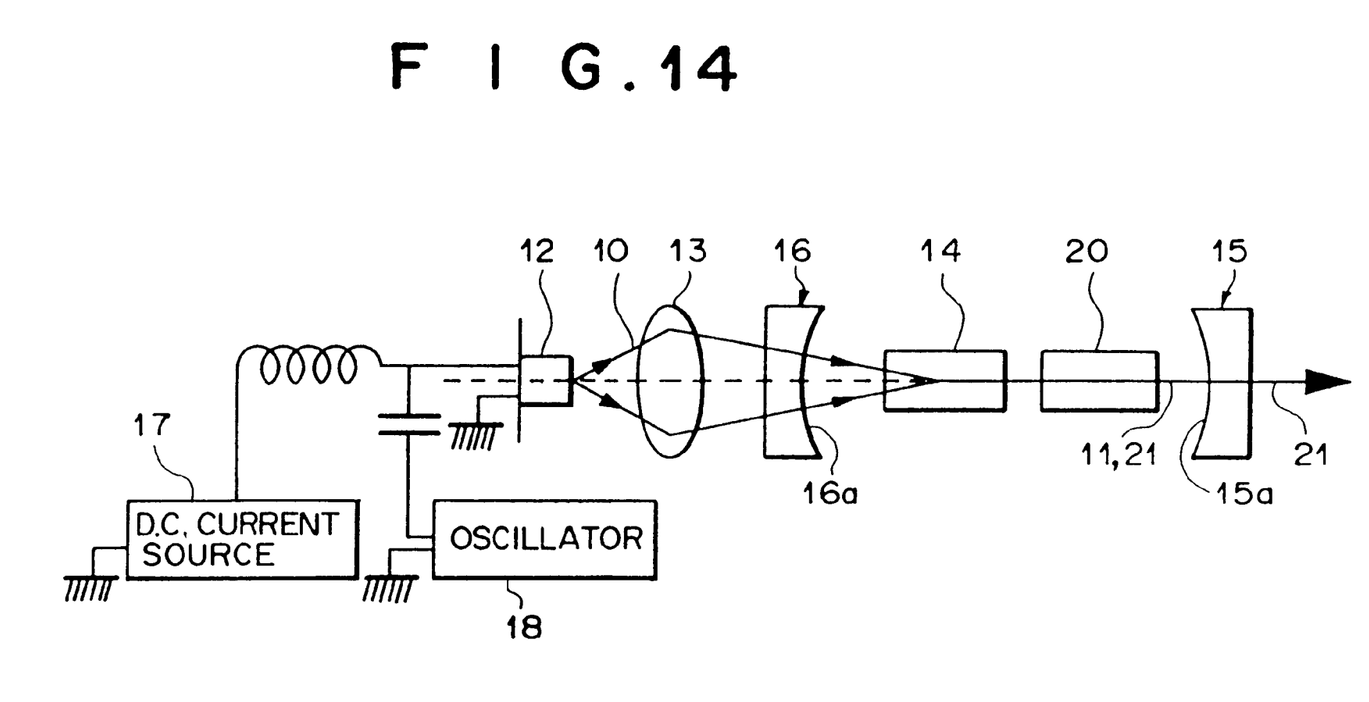
FIG. 14 is a schematic side view of a laser diode pumped solid state laser in accordance with a second embodiment of the present invention.

FIG. 14 shows a laser diode pumped solid state laser in accordance with a second embodiment of the present invention. The laser diode pumped solid state laser of this embodiment basically differs from that shown in FIG. 1 in that a nonlinear optical crystal 20 is provided in the resonator. The nonlinear optical crystal 20 converts the laser beam 11 at 1064 nm to its second harmonic 21 at 532 nm.

The mirror surface 15a of the front resonator mirror 15 is provided with coating which transmits the second harmonic 21 while highly reflects the laser beam 11 at 1064 nm and the pumping laser beam 10 at 809 nm, whereby the second harmonic 21 is radiated through the front resonator mirror 15.

Also in this embodiment, a high-frequency similar to that employed in the first embodiment is superposed on the drive current for the laser diode 12, whereby generation of noise in the second harmonic 21 is suppressed.

As the nonlinear optical crystal 20, any known nonlinear optical crystal may be employed though KTP, KN, MgO-LN ($NiNbO_3$ doped with MgO) with periodic domain reversals, LN, LT ($LiTaO_3$) and the like are preferable.

Though, in the embodiments described above, the oscillation line at 1064 nm of Nd:YAG crystal 14 is employed, the same effect can be obtained even if other oscillation lines such as that at 946 nm are employed.

Further though, in the embodiments described above, Nd:YAG crystal is employed as the solid laser medium, other solid laser media such as $Nd:YVO_4$, Nd:YLF, Nd:Glass and the like may be employed.

As the index optical waveguide laser, a multiple transverse mode laser disclosed in our Japanese Patent Application No. 9(1997)-234403 can be employed.

Further instead of the sine wave high-frequency, other various high-frequencies such as of a square wave may be superposed on the laser diode drive current.

Further, the present invention can be applied also to a laser diode pumped solid state laser with an automatic power control circuit disclosed, for instance, in Japanese Unexamined Patent Publication No. 10(1998)-98222. In this case, not only generation of noise can be suppressed but also runaway of the automatic power control circuit can be prevented.

What is claimed is:

1. A laser diode pumped solid state laser comprising
   a solid laser medium having a response frequency,
   an index optical waveguide type laser diode which emits a pumping light beam for pumping the laser medium, and
   a high frequency superposition means which is operable to superimpose on a drive current for the laser diode a high-frequency signal,
   wherein the high frequency signal has a frequency higher than the response frequency and has an amplitude which produces a percentage modulation of the light output of the laser diode having a value not smaller than 50% and smaller than 100%.

2. A laser diode pumped solid state laser as defined in claim 1, wherein the amplitude of the high-frequency signal produces a percentage modulation of the light output of the laser diode having a value not smaller than 50% and not larger than 80%.

3. A laser diode pumped solid state as defined in claim 1, wherein the frequency of the high-frequency signal is not lower than 20 MHz.

4. A laser diode pumped solid state laser as defined in claim 1, wherein the laser diode is a multiple transverse mode broad-area laser.

5. A laser diode pumped solid state laser as defined in claim 1, wherein the laser diode has index steps produced by a ridge structure.

6. A laser diode pumped solid state laser as defined in claim 1, further comprising a DC current source to provide the drive current.

7. A laser diode pumped solid state laser as defined in claim 1, wherein the percentage modulation of the light output of the laser diode is determined by the expression:

$$P_{p\text{-}p}/2P_{DC} \times 100(\%),$$

where $P_{p\text{-}p}$ represents a peak-to-peak width of the light output of the laser diode and $P_{DC}$ represents a mean light output of the laser diode.

8. The laser pumped solid state laser according to claim 1, wherein said high frequency superposition means superimposes a high frequency signal having a constant amplitude on said drive current.

9. The laser pumped solid state laser according to claim 1, wherein said high frequency superposition means superimposes a high frequency signal having a constant frequency on said drive current.

10. The laser pumped solid state laser according to claim 9, wherein said high frequency superposition means superimposes a high frequency signal which only has components above the response frequency of the laser medium.

11. The laser diode pumped solid state laser according to claim 1, wherein the solid laser medium comprises one of KTP, KN and MgO-LN materials.

12. The laser diode pumped solid state laser according to claim 11, wherein the solid laser medium further comprises one of LN and LT domain reversals.

13. The laser diode pumped solid state laser according to claim 11, wherein the solid laser medium is disposed in a resonator cavity including a first and a second resonator mirror disposed on opposite sides of the solid state laser medium.

* * * * *